United States Patent
Yanagihara et al.

(10) Patent No.: US 10,659,062 B2
(45) Date of Patent: May 19, 2020

(54) PLL CIRCUIT

(71) Applicant: Mitsubishi Electric Corporation, Tokyo (JP)

(72) Inventors: Yuki Yanagihara, Tokyo (JP); Koji Tsutsumi, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/342,825

(22) PCT Filed: Dec. 15, 2016

(86) PCT No.: PCT/JP2016/087382
§ 371 (c)(1),
(2) Date: Apr. 17, 2019

(87) PCT Pub. No.: WO2018/109898
PCT Pub. Date: Jun. 21, 2018

(65) Prior Publication Data
US 2019/0296749 A1 Sep. 26, 2019

(51) Int. Cl.
*H03K 21/00* (2006.01)
*H03L 7/095* (2006.01)
(Continued)

(52) U.S. Cl.
CPC .............. *H03L 7/095* (2013.01); *H03L 7/089* (2013.01); *H03L 7/0891* (2013.01); *H03L 7/093* (2013.01);
(Continued)

(58) Field of Classification Search
CPC ......... H03K 21/00; H03L 7/0891; H03L 7/10; H03L 7/093; H03L 7/18; H03L 7/099
See application file for complete search history.

(56) References Cited

U.S. PATENT DOCUMENTS 5,757,238 A * 5/1998 Ferraiolo ................ H03L 7/089
327/105
10,097,283 B1 * 10/2018 Yeager ................... H04B 17/11
(Continued)

FOREIGN PATENT DOCUMENTS

JP 6-61852 A 3/1994
JP 10-145229 A 5/1998

OTHER PUBLICATIONS

Jäger et al., "Concepts for Highly Integrated Automotive Radar Circuits," European Microwave Week 2015, WS12: EuMIC—SiGe for mm-Wave and THz, Palais Des Congrès, Paris, France, Sep. 6-11, 2015, 22 pages.

*Primary Examiner* — Sibin Chen
(74) *Attorney, Agent, or Firm* — Birch, Stewart, Kolasch & Birch, LLP (57) ABSTRACT

A lock detector (8) detects an unlocked state from an output of a phase frequency comparator (1). A counter (9) counts a reference signal, in a case where an unlocked state is detected by the lock detector (8). A parameter controlling circuit (10) acquires the count value of the counter (9), and controls switching on and off of a switch (12) for a D/A converter (11) that generates a signal to be added to an output of a loop filter (3), and the output voltage of the D/A converter (11) so that the count value of the counter (9) falls within a set value.

3 Claims, 7 Drawing Sheets

(51) Int. Cl.
*H03L 7/089* (2006.01)
*H03L 7/099* (2006.01)
*H03L 7/197* (2006.01)
*H03L 7/107* (2006.01)
*H03L 7/093* (2006.01)
*H03K 19/20* (2006.01)

(52) U.S. Cl.
CPC .............. *H03L 7/099* (2013.01); *H03L 7/107* (2013.01); *H03L 7/197* (2013.01); *H03K 19/20* (2013.01)

(56) References Cited

U.S. PATENT DOCUMENTS

2014/0241335 A1* 8/2014 Chen ................. H03L 7/093
370/342
2014/0312943 A1* 10/2014 Canard ................. H03L 7/095
327/156

* cited by examiner

PLL CIRCUIT

TECHNICAL FIELD

The present invention relates to a PLL circuit that compares the phase of an output signal of a voltage-controlled oscillator (hereinafter referred to as VCO) with the phase of a reference signal, and feeds the comparison result back to the VCO, to stabilize the oscillation frequency of the VCO.

BACKGROUND ART

A PLL circuit is a circuit that compares the phase of an output signal of a VCO with the phase of a reference signal, and feeds the comparison result back to the VCO, to stabilize the oscillation frequency of the VCO. In a case where a signal with a frequency that steeply changes like sawtooth waves is to be output, the PLL circuit cannot follow the set waveform at a time point when the frequency changes steeply, and it takes time for the PLL circuit to again output a correct frequency. To solve this problem by a conventional technique, a D/A converter (DAC) is connected to a control terminal of a VCO via a switch, the switch is put into an ON-state at a time point when the frequency steeply changes, and thus the output of the DAC is supplied to the control terminal of the VCO. In this manner, the time required for the PLL to again output a correct frequency is shortened (see Non-Patent Document 1, for example).

CITATION LIST

Non-Patent Literature

Non-Patent Literature 1: Herbert Jaeger and Matthias Porranzl, "Concepts for Highly Integrated Automotive Radar Circuits", EuMW 2015, WS 12: EuMIC-7-SiGe for mm-Wave and THz

SUMMARY OF INVENTION

Technical Problem

However, a problem with the above conventional PLL circuit is that the characteristics of the VCO, the DAC and others change with process variations and temperature fluctuations, and, because of that, it is difficult to obtain parameters such as an applied voltage and an application time required for appropriate implementation of the above technique. Therefore, the conventional PLL circuit cannot easily cope with an output signal with steep frequency changes.

The present invention has been made to solve the above problem, and aims to provide a PLL circuit capable of readily obtaining suitable parameters and coping with output signals with steep frequency changes.

Solution to Problem

A PLL circuit according to this invention includes: a voltage-controlled oscillator to transmit a frequency signal corresponding to a voltage of a supplied signal; a frequency divider to perform frequency dividing on an output of the voltage-controlled oscillator; a phase frequency comparator to compare an output of the frequency divider with a reference signal; a first charge pump to output a signal corresponding to a result of the comparison performed by the phase frequency comparator; a loop filter to supply a signal obtained by smoothing the output signal of the first charge pump to the voltage-controlled oscillator; a lock detector to detect a locked state and an unlocked state from an output of the phase frequency comparator; a counter to be reset when an output of the lock detector switches from the locked state to the unlocked state, and to count the reference signal while the unlocked state is being detected; a D/A converter to generate a signal to be added to an output of the loop filter; a switch to switch whether to supply an output signal of the D/A converter; and a parameter controlling circuit to acquire a count value of the counter, and control switching on and off of the switch and an output voltage of the D/A converter so that the count value of the counter is restricted within a set value.

Advantageous Effects of Invention

A PLL circuit according to the present invention includes a lock detector that detects a locked state and an unlocked state from an output of a phase frequency comparator, and controls the output voltage of a D/A converter and the switching on and off of a switch so that the unlocked state falls within a set value. With this configuration, an output signal to be added of the D/A converter can be made to accurately follow changes in frequency, and the PLL circuit can cope with an output signal with steep frequency changes.

DESCRIPTION OF EMBODIMENTS

To explain the present invention in greater detail, modes for carrying out the invention are described below with reference to the accompanying drawings.

First Embodiment

Figure 1:
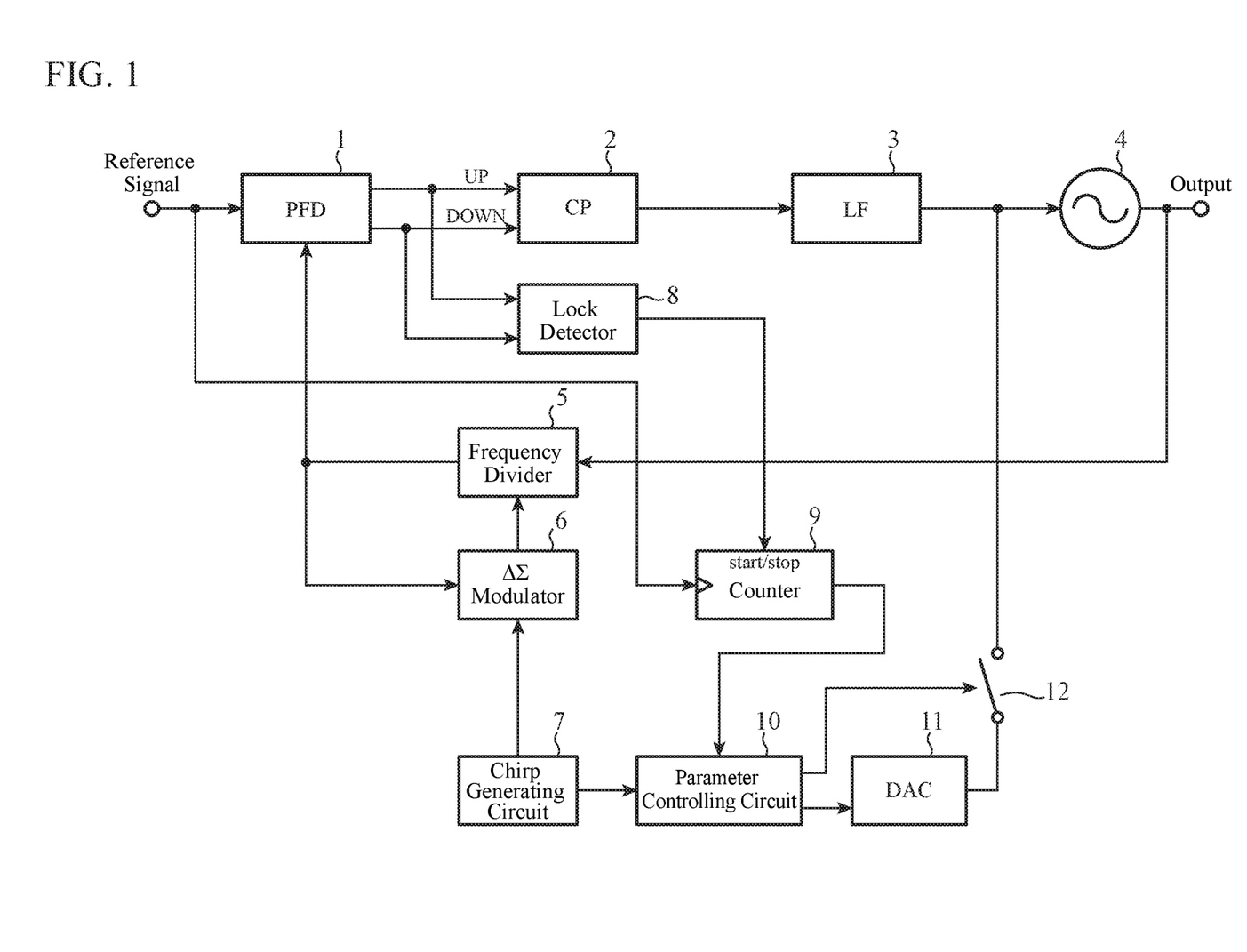
FIG. 1 is a configuration diagram of a PLL circuit according to a first embodiment of the present invention.

FIG. 1 is a configuration diagram of a PLL circuit according to a first embodiment. The PLL circuit includes a phase frequency comparator (PFD) 1, a charge pump (CP) 2, a loop filter (LF) 3, a voltage-controlled oscillator (VCO) 4, a frequency divider 5, a ΔΣ modulator 6, a chirp generating circuit 7, a lock detector 8, a counter 9, a parameter controlling circuit 10, a D/A converter (DAC) 11, and a switch 12.

The phase frequency comparator 1 is a circuit that compares the frequency and the phase of a reference signal with the frequency and the phase of an output signal of the voltage-controlled oscillator 4, and transmits an up signal (UP) and a down signal (DOWN) as a result of the comparison. The charge pump 2 is a circuit that receives the output signal of the phase frequency comparator 1, and outputs a pulse signal of the current corresponding to the output signal. The loop filter 3 is a filter that performs smoothing as well as current-voltage conversion on the output signal of the charge pump 2, and output the resultant signal. The voltage-controlled oscillator 4 is a circuit that generates an oscillation signal that is to be an output of the PLL circuit. An added signal of the output signal of the loop filter 3 and an output signal of the D/A converter 11 is supplied to a frequency control terminal of the voltage-controlled oscillator 4. The frequency divider 5 is a circuit that receives the output of the voltage-controlled oscillator 4, and performs frequency dividing by N (N being an integer) on the basis of a control signal from the ΔΣ modulator 6. The ΔΣ modulator 6 is a circuit that generates a control signal for the frequency dividing ratio in the frequency divider 5, on the basis of an output value of the chirp generating circuit 7. The chirp generating circuit 7 is a circuit that generates a chirp signal, and outputs a frequency dividing ratio signal to the ΔΣ modulator 6. The chirp generating circuit 7 also outputs a frequency jump signal indicating that the output frequency of the PLL circuit steeply changes, to the parameter controlling circuit 10.

The lock detector 8 is a circuit that detects a locked state and an unlocked state of the PLL circuit, on the basis of the up signal and the down signal of the phase frequency comparator 1. This will be described later. The counter 9 is a counter that is reset when the output of the lock detector 8 switches from a locked state to an unlocked state, and counts the reference signal while an unlocked state is being detected. The parameter controlling circuit 10 is a circuit that acquires a count value of the counter 9 upon receipt of the frequency jump signal from the chirp generating circuit 7, and controls the output voltage of the D/A converter 11 and the on and off time periods of the switch 12, to minimize the count value. The D/A converter 11 is a circuit that outputs an analog signal of the voltage value corresponding to a control signal supplied from the parameter controlling circuit 10. The switch 12 is a switch for switching whether to add the output of the D/A converter 11 to the output of the loop filter 3, under the control of the parameter controlling circuit 10.

Figure 2:
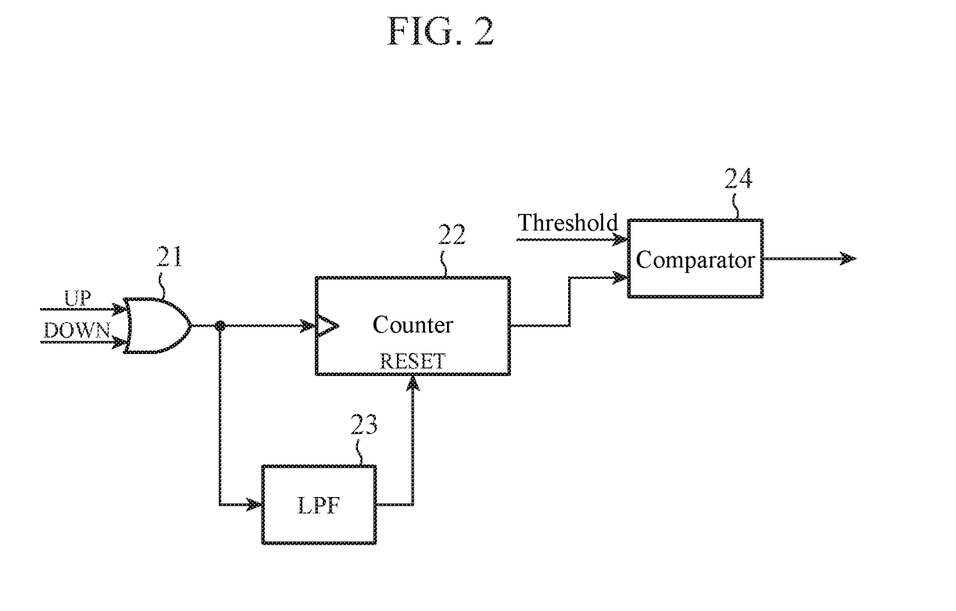
FIG. 2 is a configuration diagram showing a lock detector of the PLL circuit according to the first embodiment of the present invention.

FIG. 2 is a configuration diagram specifically showing the lock detector 8.

As shown in the drawing, the lock detector 8 includes an OR gate 21, a counter 22, a low-pass filter (LPF) 23, and a comparator 24. The OR gate 21 is a circuit that performs an OR operation, using inputs of the up signal and the down signal from the phase frequency comparator 1. The counter 22 is a counter that counts the output pulse of the OR operation result from the OR gate 21, and is reset by an output from the low-pass filter 23. The low-pass filter 23 is a filter that passes only signals of a frequency equal to or lower than a set value. The comparator 24 is a circuit that receives a preset threshold value, and compares the count value of the counter 22 with the threshold value. In a case where the count value exceeds the threshold value, the comparator 24 detects a locked state, and outputs a signal indicating the locked state.

Next, the operation of the PLL circuit according to the first embodiment is described.

First, a basic operation of the PLL circuit is described. An output of the voltage-controlled oscillator 4 is frequency-divided by the frequency divider 5, and the frequency-divided signal is supplied to the phase frequency comparator 1 and the ΔΣ modulator 6. The ΔΣ modulator 6 outputs a control signal for the frequency dividing ratio in the frequency divider 5, on the basis of a frequency dividing ratio signal from the chirp generating circuit 7. The phase frequency comparator 1 compares the phase and the frequency of the signal from the frequency divider 5 with the phase and the frequency of the reference signal. In a case where the frequency-divided signal is higher in frequency than the reference signal, a down signal is output. In a case where the frequency-divided signal is lower in frequency than the reference signal, an up signal is output. The charge pump 2 receives the up signal and the down signal from the phase frequency comparator 1, and transmits signals of the currents corresponding to these respective received signals. The loop filter 3 performs smoothing as well as current-voltage conversion on the output signal of the charge pump 2, and outputs the resultant signal to the voltage-controlled oscillator 4. The above operation is the basic operation of the PLL circuit.

Next, control by detecting an unlocked state is described.

In the lock detector 8, an up signal and a down signal from the phase frequency comparator 1 are supplied to the OR gate 21. When the output pulse of the OR gate 21 has a great width, the pulse passes through the low-pass filter 23, and the counter 22 is reset. Therefore, the count value of the counter 22 is 0. When the output pulse of the OR gate 21 has a small width, on the other hand, the pulse does not pass through the low-pass filter 23. Therefore, the counter 22 is not reset, and thus the count value of the counter 22 increases. The count value of the counter 22 is compared with the preset threshold value by the comparator 24. When the count value is equal to or greater than the threshold value, the comparator 24 outputs a signal indicating a locked state. That is, a signal indicating a locked state is output from the lock detector 8. When a pulse with a great width is again output from the OR gate 21, the counter 22 is reset, and the comparator 24 outputs a signal indicating an unlocked state. That is, the lock detector 8 outputs a signal of an unlocked state.

At a portion where the output frequency of the PLL circuit changes steeply, or at a portion where the change in the output frequency is equal to or greater than a threshold value, the PLL circuit becomes unable to follow the set frequency and enters an unlocked state, and the lock detector 8 detects the unlocked state. The counter 9 is reset when the output of the lock detector 8 switches from the locked state to the unlocked state, and counts the reference signal while the unlocked state is being detected. In this manner, an unlock time of the PLL circuit is detected. The parameter controlling circuit 10 controls the output voltage of the D/A converter 11 and the on-duration of the switch 12, to minimize the count value of the counter 9. In minimizing the count value, for example, it is possible to use a method of determining a parameter with which the unlock time becomes the shortest by sweeping the output voltage of the D/A converter 11 and the on-duration of the switch 12 over their respective entire ranges, or a conventional minimization algorithm such as a gradient descent method.

Figure 3A:
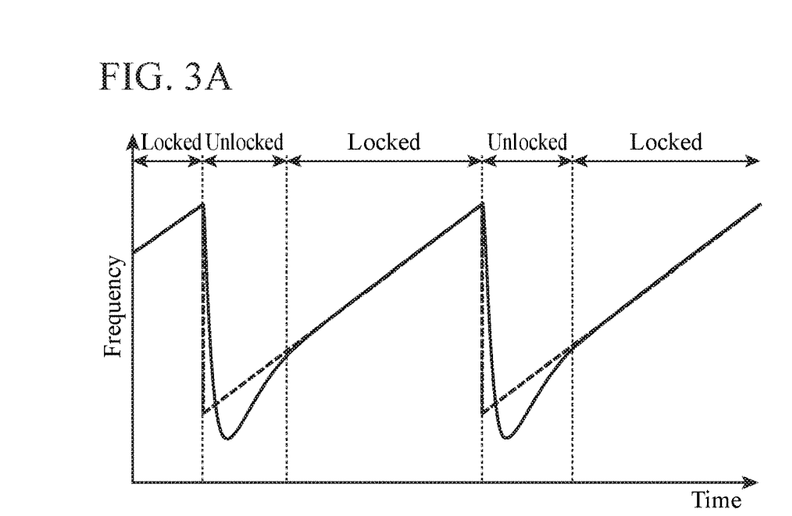
FIGS. 3A through 3C each show a graph for explaining the relationship between the amount applied by a D/A converter and an unlock time in the PLL circuit according to the first embodiment of the present invention.
Figure 3B:
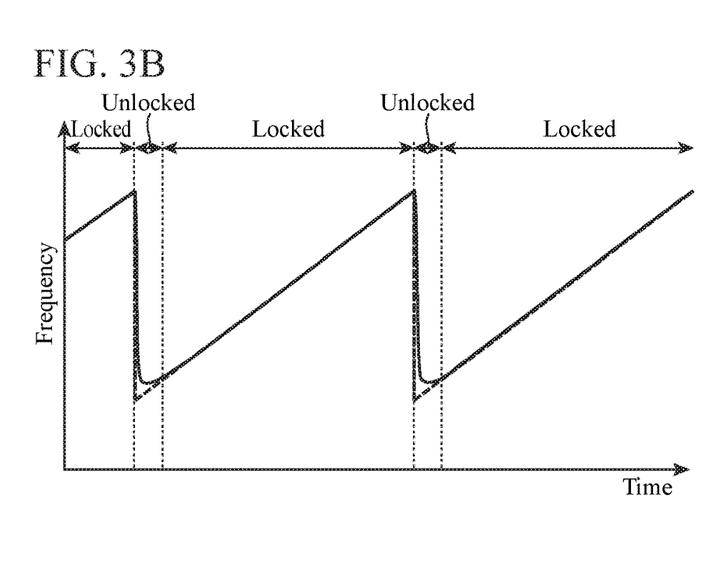
Figure 3C:
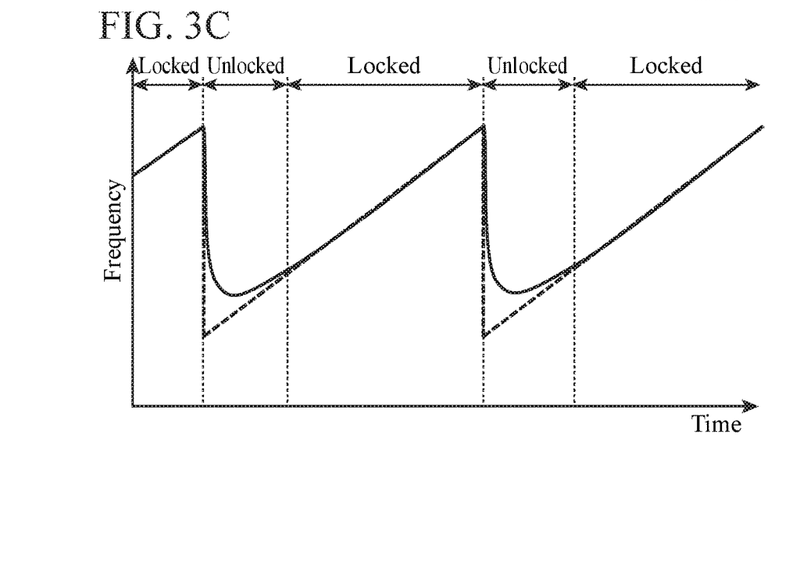

FIGS. 3A through 3C are graphs for explaining the relationship between the amount applied by the D/A converter 11 and the unlock time. Note that in each graph, a dashed line represents an ideal waveform, and a solid line represents an output waveform of the PLL circuit. As shown in these graphs, in a case where the applied amount from the D/A converter 11 is too large (FIG. 3A) and a case where the applied amount is too small (FIG. 3C), the unlock time is longer than that in a case where the amount applied by the D/A converter 11 is appropriate (FIG. 3B). By using this feature, the lock detector 8 and the counter 9 observe the unlock time, and the parameter controlling circuit 10 determines the parameter for the amount applied by the D/A converter 11, to minimize the unlock time.

Note that, in the above example, the parameter controlling circuit 10 performs control to minimize the count value of the counter 9. However, control may be performed to restrict the count value of the counter 9 within a predetermined counter set value.

As described above, the PLL circuit according to the first embodiment includes: a voltage-controlled oscillator that transmits a frequency signal corresponding to the voltage of a supplied signal; a frequency divider that performs frequency dividing on the output of the voltage-controlled oscillator; a phase frequency comparator that compares the output of the frequency divider with a reference signal; a charge pump that outputs a signal corresponding to a result of the comparison performed by the phase frequency comparator; a loop filter that supplies a signal obtained by smoothing the output signal of the charge pump to the voltage-controlled oscillator; a lock detector that detects a locked state and an unlocked state from the output of the phase frequency comparator; a counter that is reset when the output of the lock detector switches from a locked state to an unlocked state, and counts the reference signal while an unlocked state is being detected; a D/A converter that generates a signal to be added to the output of the loop filter; a switch that switches whether to supply the output signal of the D/A converter; and a parameter controlling circuit that acquires the count value of the counter, and controls the switching on and off of the switch and the output voltage of the D/A converter so that the count value of the counter is restricted within a set value. With this configuration, even if the characteristics of the voltage-controlled oscillator and the D/A converter change, it is possible to obtain an appropriate application parameter for the signal to be added. As a result, the PLL circuit can cope with an output signal with a steep frequency change.

Further, in the PLL circuit according to the first embodiment, the parameter controlling circuit performs control at a time when the change in the output frequency of the PLL circuit is equal to or greater than a threshold value. Thus, an application parameter for the signal to be added can be determined at an appropriate timing.

Second Embodiment

Figure 4:
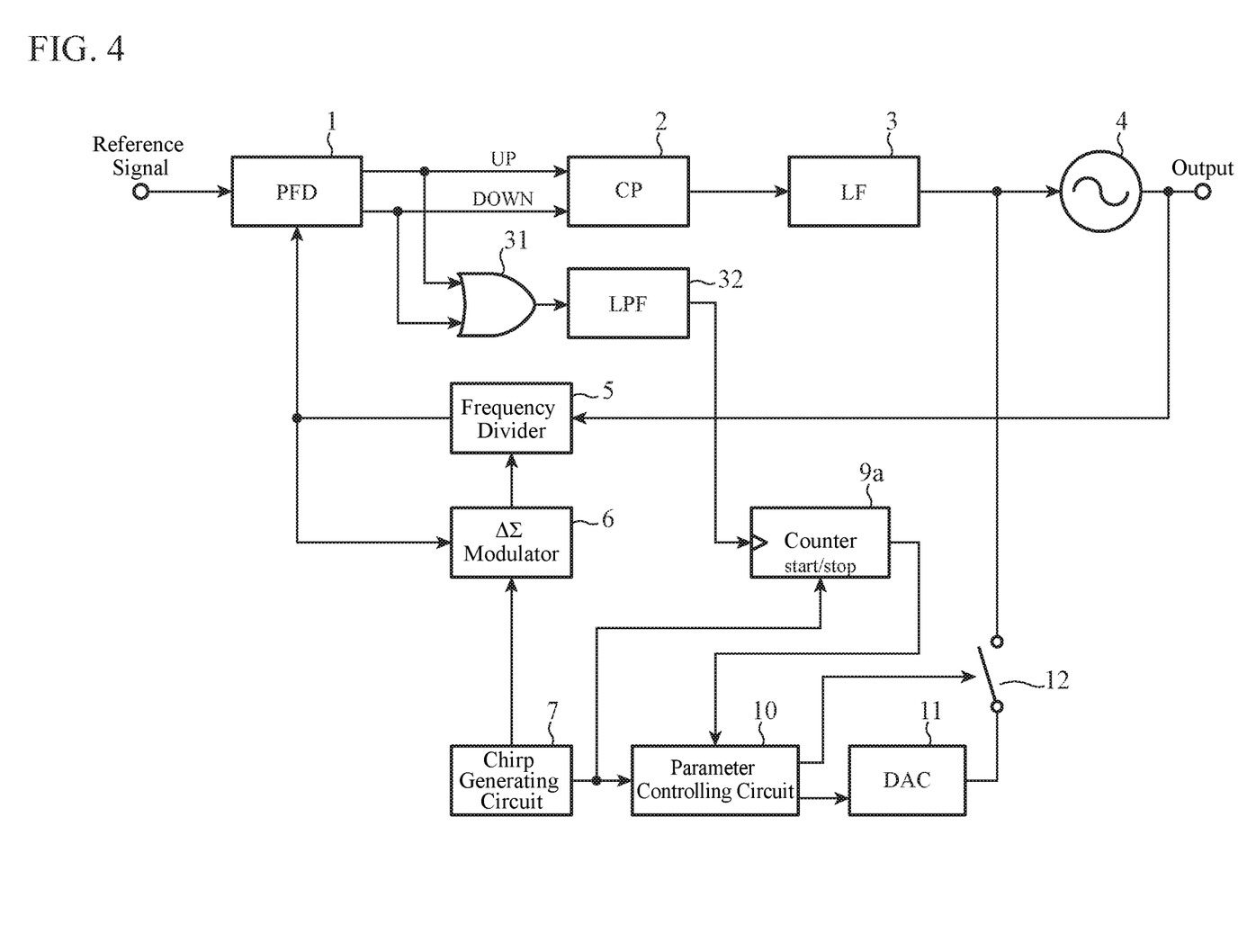
FIG. 4 is a configuration diagram of a PLL circuit according to a second embodiment of the present invention.

FIG. 4 is a configuration diagram of a PLL circuit according to a second embodiment. The PLL circuit according to the second embodiment includes a phase frequency comparator 1, a charge pump 2, a loop filter 3, a voltage-controlled oscillator 4, a frequency divider 5, a ΔΣ modulator 6, a chirp generating circuit 7, a counter 9a, a parameter controlling circuit 10, a D/A converter 11, a switch 12, an OR gate 31, and a low-pass filter (LPF) 32. That is, the second embodiment includes the OR gate 31 and the low-pass filter 32, instead of the lock detector 8 in the first embodiment. Except for the OR gate 31, the low-pass filter 32, and the counter 9a, the configuration is the same as the configuration of the first embodiment shown in FIG. 1. Therefore, the corresponding components are denoted by the same reference numerals as those used in FIG. 1, and explanation thereof is not made herein.

The OR gate 31 receives an up signal and a down signal that are output from the phase frequency comparator 1, and performs an OR operation on the up signal and the down signal. The low-pass filter 32 is a filter for passing a signal of a low frequency component (a pulse having a greater width than a predetermined pulse width set value) in the output of the OR gate 31, and is designed so that the output of the low-pass filter 32 is supplied to the counter 9a. The counter 9a is designed to count the pulse signal from the low-pass filter 32, and to be reset upon receipt of a frequency jump signal from the chirp generating circuit 7.

The basic operation of the PLL circuit of the second embodiment designed as above is the same as that of the first embodiment. Meanwhile, the control by detecting an unlocked state in the second embodiment is performed as follows.

After the chirp generating circuit 7 outputs the frequency jump signal, the PLL circuit becomes unable to follow steep frequency changes, and enters an unlocked state. As a result, the output pulse width of the up signal or the down signal from the phase frequency comparator 1 becomes greater, and the output pulse width of the OR gate 31 also becomes greater. The wide output pulse passes through the low-pass filter 32, and is counted by the counter 9a. After that, the PLL circuit is eventually locked, and the output pulse of the OR gate 31 becomes narrower and thus ceases to pass through the low-pass filter 32. Therefore, the counter 9a stops. The parameter controlling circuit 10 controls the output voltage of the DAC 11 and the on-duration of the switch 12, to minimize the count value of the counter 9a, as in the first embodiment. As a result, an appropriate application parameter can be obtained as in the first embodiment.

Note that, in the above example, the parameter controlling circuit 10 performs control to minimize the count value of the counter 9a. However, control may be performed to restrict the count value of the counter 9a within a predetermined counter set value.

As described above, the PLL circuit according to the second embodiment includes: a voltage-controlled oscillator that transmits a frequency signal corresponding to the voltage of a supplied signal; a frequency divider that performs frequency dividing on the output of the voltage-controlled oscillator; a phase frequency comparator that compares the output of the frequency divider with a reference signal; a charge pump that outputs a signal corresponding to a result of the comparison performed by the phase frequency comparator; a loop filter that supplies a signal obtained by smoothing the output signal of the charge pump to the voltage-controlled oscillator; an OR gate that performs an OR operation, using inputs of an up signal and a down signal of the phase frequency comparator; a low-pass filter that passes a pulse having a greater width than a pulse width set value in the output of the OR gate; a counter that counts the output pulse of the low-pass filter, and is reset at a time when the change in the output frequency of the PLL circuit is equal to or larger than a threshold value; a D/A converter that generates a signal to be added to the output of the loop filter; a switch that switches whether to supply the output signal of the D/A converter; and a parameter controlling circuit that acquires the count value of the counter, and controls the switching on and off of the switch and the output voltage of the D/A converter, to restrict the count value of the counter within a counter set value. With this configuration, the circuit for detecting an unlocked state can be simplified. Thus, power consumption can be reduced, and a size reduction can be achieved.

Third Embodiment

Figure 5:
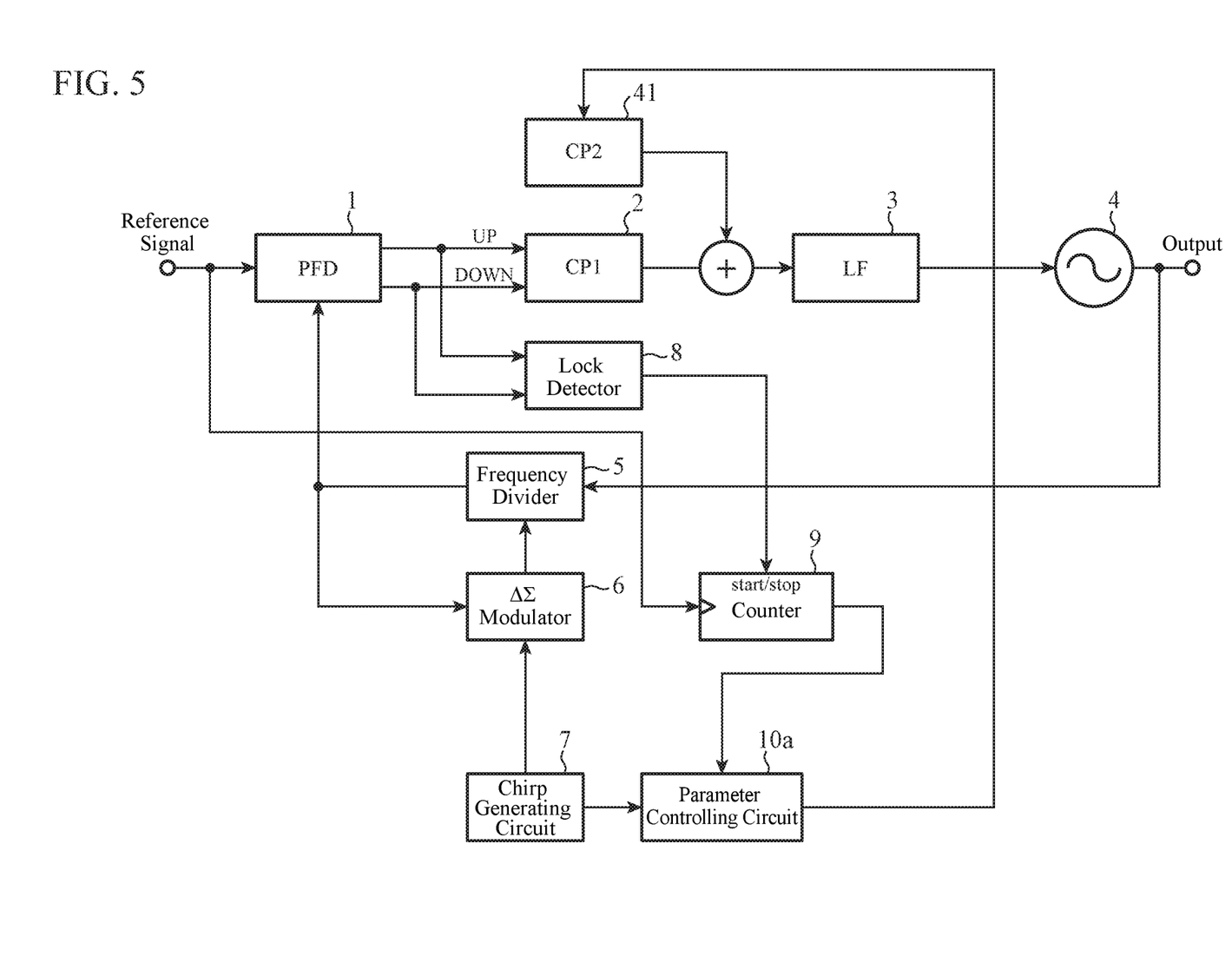
FIG. 5 is a configuration diagram of a PLL circuit according to a third embodiment of the present invention.

FIG. 5 is a configuration diagram of a PLL circuit according to a third embodiment.

The PLL circuit according to the third embodiment includes a phase frequency comparator 1, a first charge pump (CP1) 2, a loop filter 3, a voltage-controlled oscillator 4, a frequency divider 5, a ΔΣ modulator 6, a chirp generating circuit 7, a lock detector 8, a counter 9, a parameter controlling circuit 10a, and a second charge pump (CP2) 41. That is, in the configuration of the third embodiment, the D/A converter 11 and the switch 12 of the first embodiment are removed, the output of the newly added second charge pump 41 is connected to the output of the first charge pump 2, and the parameter controlling circuit 10a controls the second charge pump 41. Note that the first charge pump 2 is the same as the charge pump 2 in the first and second embodiments. The other components and operation are the same as the corresponding components and operation of the first embodiment. Therefore, the corresponding components are denoted by the same reference numerals as those used in the first embodiment, and explanation thereof is not made herein.

Next, the operation of the PLL circuit according to the third embodiment is described.

Upon receipt of a frequency jump signal from the chirp generating circuit 7, the parameter controlling circuit 10a causes the second charge pump 41 to operate with a predetermined output current for a predetermined time. The parameter controlling circuit 10a controls the output current and the on-duration of the second charge pump 41, to minimize the unlock time to be measured by the counter 9, as in the first embodiment. For example, as disclosed in Non-Patent Document 1, an appropriate current is injected by a charge pump at a time point when the frequency steeply changes, so that the time required until a correct frequency is again output can be shortened.

Figure 6A:
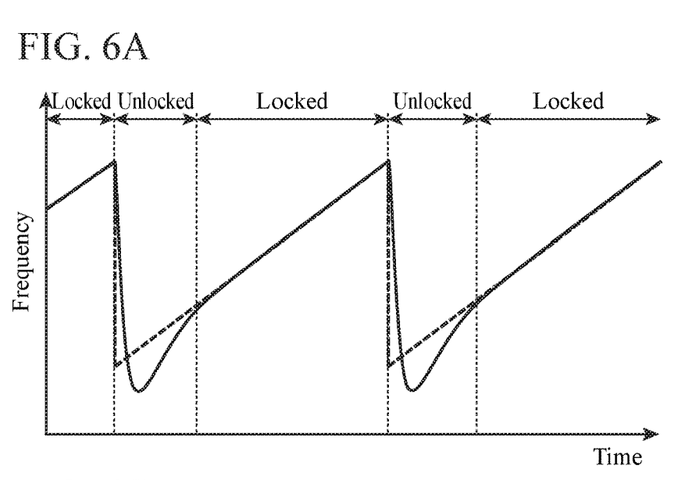
FIGS. 6A through 6C each show a graph for explaining the relationship between the amount applied by a second charge pump and an unlock time in the PLL circuit according to the third embodiment of the present invention.
Figure 6B:
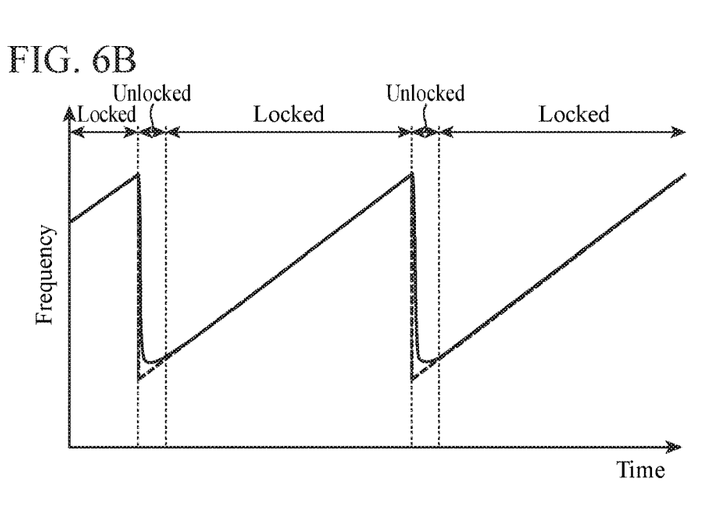
Figure 6C:
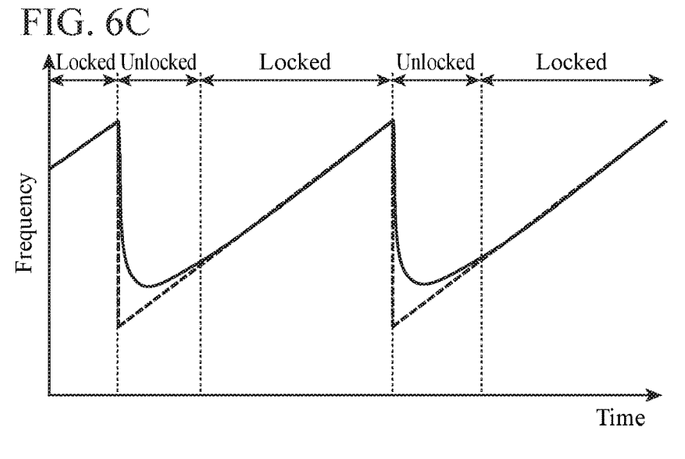

FIGS. 6A through 6C are graphs for explaining the relationship between the amount applied by the second charge pump 41 and the unlock time. Note that in each graph, a dashed line represents an ideal waveform, and a solid line represents an output waveform of the PLL circuit. As shown in these graphs, in a case where the applied amount from the second charge pump 41 is too large (FIG. 6A) and a case where the applied amount is too small (FIG. 6C), the unlock time is longer than that in a case where the amount applied by the second charge pump 41 is appropriate (FIG. 6B). By using this feature, the parameter controlling circuit 10a observes the unlock time, and controls the application parameter to minimize the unlock time. Thus, an appropriate application parameter can be obtained.

Note that, in the above example, the parameter controlling circuit 10a performs control to minimize the count value of the counter 9. However, control may be performed to restrict the count value of the counter 9 within a predetermined counter set value.

As described above, in the PLL circuit according to the third embodiment, a second charge pump that generates a signal to be added to the output of a first charge pump depending on a supplied parameter is provided in place of the D/A converter and the switch of the first and second embodiments, and a parameter controlling circuit that acquires the count value of the counter, and controls the parameter for the second charge pump to restrict the count value of the counter within a set value is provided in place of the parameter controlling circuit of the first and second embodiments. With this configuration, even if the characteristics of the voltage-controlled oscillator and the D/A converter change, it is possible to obtain an appropriate application parameter for the signal to be added. As a result, the PLL circuit can cope with an output signal with a steep frequency change.

Fourth Embodiment

Figure 7:
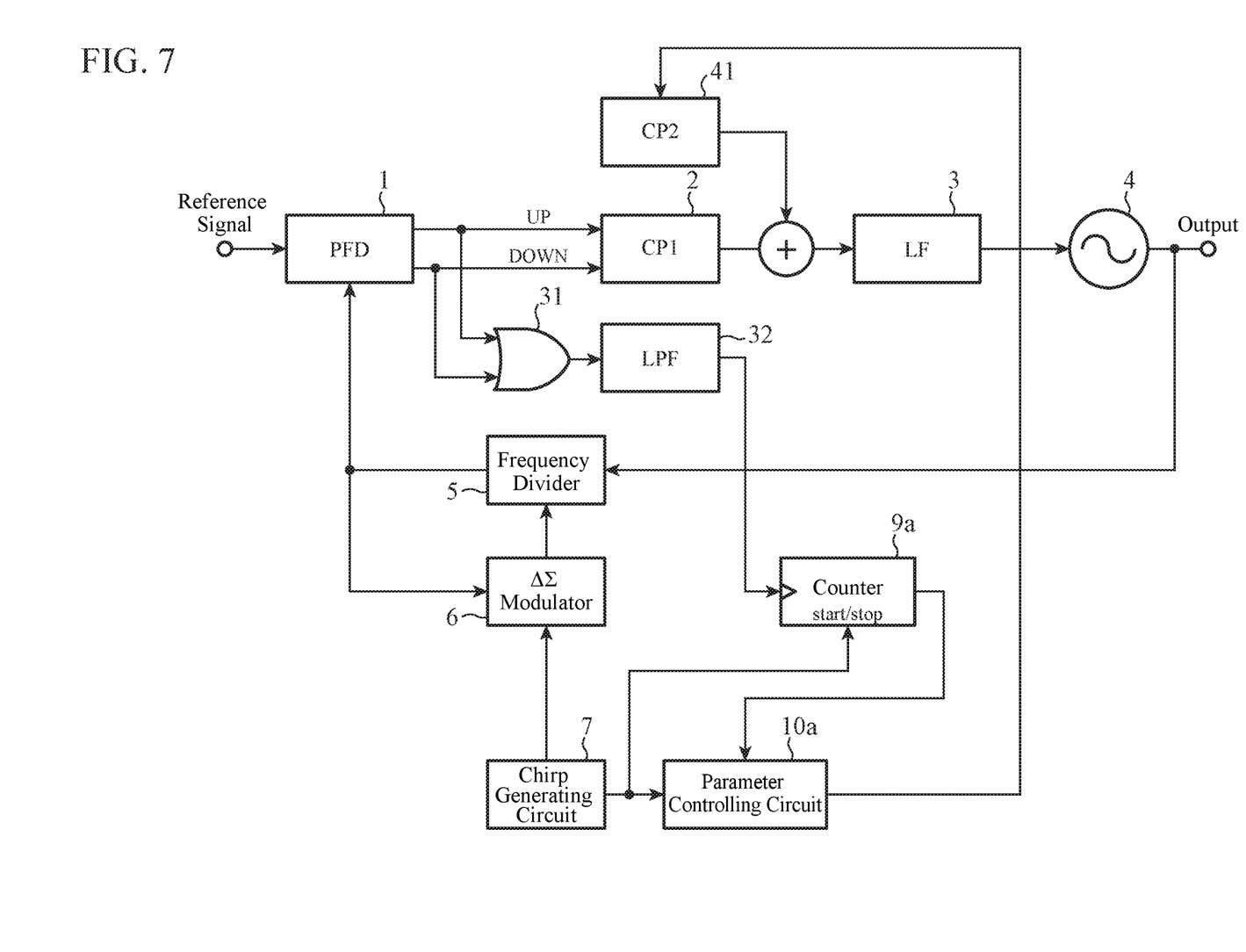
FIG. 7 is a configuration diagram of a PLL circuit according to a fourth embodiment of the present invention.

FIG. 7 is a configuration diagram of a PLL circuit according to a fourth embodiment. The PLL circuit according to the fourth embodiment includes a phase frequency comparator 1, a first charge pump 2, a loop filter 3, a voltage-controlled oscillator 4, a frequency divider 5, a ΔΣ modulator 6, a chirp generating circuit 7, a counter 9a, a parameter controlling circuit 10a, an OR gate 31, a low-pass filter 32, and a second charge pump 41. That is, the fourth embodiment includes the OR gate 31 and the low-pass filter 32, instead of the lock detector 8 in the third embodiment. The other components and operation are the same as the corresponding components and operation of the third embodiment. Therefore, the corresponding components are denoted by the same reference numerals as those used in the third embodiment, and explanation thereof is not made herein.

Next, the operation according to the fourth embodiment is described.

There are the following differences from the third embodiment. The output of the phase frequency comparator 1 is input to the OR gate 31, not to the lock detector 8. The output of the OR gate 31 is supplied to the low-pass filter 32, and the output of the low-pass filter 32 is counted by the counter 9a. Meanwhile, the chirp generating circuit 7 outputs a frequency jump signal to the counter 9a. Upon receipt of the frequency jump signal, the counter 9a is reset.

After the chirp generating circuit 7 outputs the frequency jump signal, the PLL circuit becomes unable to follow steep frequency changes and enters an unlocked state, and the output pulse of the OR gate 31 becomes wider. The wide output pulse passes through the low-pass filter 32, and is counted by the counter 9a. After that, the PLL circuit is eventually locked, and the output pulse of the OR gate 31 becomes narrower and thus ceases to pass through the low-pass filter 32. Therefore, the counter 9a stops. The parameter controlling circuit 10a controls the output current and the on-duration of the second charge pump 41, to minimize the count value of the counter 9a, as in the third embodiment. As a result, an appropriate application parameter can be obtained as in the third embodiment.

Note that, also in the fourth embodiment, the parameter controlling circuit 10a may also control the count value of the counter 9a so that the count value falls within a predetermined counter set value.

As described above, in the PLL circuit according to the fourth embodiment, a second charge pump that generates a signal to be added to the output of a first charge pump depending on a supplied parameter is provided in place of the D/A converter and the switch of the second embodiment, and a parameter controlling circuit that acquires the count value of the counter, and controls the parameter for the second charge pump to restrict the count value of the counter within a set value is provided in place of the parameter controlling circuit of the second embodiment. With this configuration, the circuit for detecting an unlocked state can be simplified. Thus, power consumption can be reduced, and a size reduction can be achieved.

Note that, within the scope of the present invention, the embodiments may be freely combined, modification may be made to any component of each embodiment, or any component may be omitted from each embodiment.

INDUSTRIAL APPLICABILITY

As described above, a PLL circuit according to the present invention has a configuration in which the output of a D/A converter is added to the output of a loop filter at a time when the output frequency steeply changes, or a configuration in which the output of a second charge pump is added to the output of a first charge pump at the time. In such a configuration, an application parameter is determined so as to minimize the unlock time, and the PLL circuit appropriately generates a chirp signal to be used as a transmitter pulse of a FMCW radar.

REFERENCE SIGNS LIST

1: Phase frequency comparator, 2: Charge pump (first charge pump), 3: Loop filter, 4: Voltage-controlled oscillator, 5: Frequency divider, 6: ΔΣ modulator, 7: Chirp generating circuit, 8: Lock detector, 9, 9a: Counter, 10, 10a: Parameter controlling circuit, 11: D/A converter, 12: Switch, 21, 31: OR gate, 22: Counter, 23, 32: Low-pass filter, 24: Comparator, 41: Second charge pump.

The invention claimed is:

1. A PLL circuit comprising:
a voltage-controlled oscillator to transmit a frequency signal corresponding to a voltage of a supplied signal;
a frequency divider to perform frequency dividing on an output of the voltage-controlled oscillator;
a phase frequency comparator to compare an output of the frequency divider with a reference signal;
a first charge pump to output a signal corresponding to a result of the comparison performed by the phase frequency comparator;
a loop filter to supply a signal obtained by smoothing the output signal of the first charge pump to the voltage-controlled oscillator;
a lock detector to detect a locked state and an unlocked state from an output of the phase frequency comparator;
a counter to be reset when an output of the lock detector switches from the locked state to the unlocked state, and to count the reference signal while the unlocked state is being detected;
a D/A converter to generate a signal to be added to an output of the loop filter;
a switch to switch whether to supply an output signal of the D/A converter; and
a parameter controlling circuit to acquire a count value of the counter, and control switching on and off of the switch and an output voltage of the D/A converter so that the count value of the counter is restricted within a set value.

2. The PLL circuit according to claim 1, wherein the parameter controlling circuit performs the control at a time when a change in an output frequency of the PLL circuit is equal to or greater than a threshold value.

3. The PLL circuit according to claim 1, wherein
a second charge pump for generating a signal to be added to an output of the first charge pump depending on a supplied parameter, is provided in place of the D/A converter and the switch of claim 1, and
a parameter controlling circuit for acquiring a count value of the counter and controlling the parameter for the second charge pump to restrict the count value of the counter within a set value, is provided in place of the parameter controlling circuit of claim 1.

* * * * *